(12) United States Patent
Kawasumi et al.

(10) Patent No.: US 11,201,191 B2
(45) Date of Patent: Dec. 14, 2021

(54) SEMICONDUCTOR MEMORY DEVICE HAVING A PLURALITY OF MEMORY CELLS EACH HAVING A PHASE CHANGE MATERIAL

(71) Applicant: TOSHIBA MEMORY CORPORATION, Tokyo (JP)

(72) Inventors: Atsushi Kawasumi, Fujisawa Kanagawa (JP); Tsuneo Inaba, Kamakura Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 202 days.

(21) Appl. No.: 16/558,822

(22) Filed: Sep. 3, 2019

(65) Prior Publication Data

US 2020/0295087 A1     Sep. 17, 2020

(30) Foreign Application Priority Data

Mar. 15, 2019 (JP) .............................. JP2019-048620

(51) Int. Cl.
| | | |
|---|---|---|
| H01L 47/00 | (2006.01) | |
| H01L 27/24 | (2006.01) | |
| H01L 45/00 | (2006.01) | |
| H01L 27/10 | (2006.01) | |
| H01L 21/822 | (2006.01) | |

(52) U.S. Cl.
CPC ...... *H01L 27/2481* (2013.01); *H01L 21/8221* (2013.01); *H01L 27/10* (2013.01); *H01L 45/06* (2013.01); *H01L 45/1293* (2013.01); *H01L 45/141* (2013.01)

(58) Field of Classification Search
CPC ... H01L 45/144; H01L 27/2481; H01L 45/06; H01L 45/1293; H01L 45/141; H01L 27/10; H01L 27/11; H01L 21/8221
See application file for complete search history.

(56) References Cited

U.S. PATENT DOCUMENTS 7,919,767 B2    4/2011  Hayakawa
8,023,312 B2    9/2011  Yamazaki et al.
10,224,371 B2*  3/2019  Wu ........................ H01L 45/06
(Continued)

FOREIGN PATENT DOCUMENTS

JP        2013-179203 A     9/2013

*Primary Examiner* — Alonzo Chambliss
(74) *Attorney, Agent, or Firm* — Kim & Stewart LLP (57) ABSTRACT

A semiconductor memory device includes a first wiring extending in a first direction, a second wiring above the first wiring and extending in a second direction, first and second memory cells electrically connected in parallel between the first and second wirings and each including a phase change material, a first insulating film on a side portion of the first cell facing the second cell in the second direction, a third wiring above the second wiring and extending in the second direction, a fourth wiring above the third wiring and extending in the first direction, third and fourth memory cells electrically connected between the third and fourth wirings in parallel and each including a phase change material, and a second insulating film on a side of the third cell facing the fourth cell in the second direction. The first film has a higher thermal insulation capacity than the second film.

20 Claims, 11 Drawing Sheets

(56) References Cited

U.S. PATENT DOCUMENTS

| | | | |
|---|---|---|---|
| 2013/0161582 A1* | 6/2013 | Arayashiki | H01L 27/2472 257/4 |
| 2018/0026077 A1* | 1/2018 | Wu | H01L 45/144 257/4 |
| 2019/0148456 A1* | 5/2019 | Wu | H01L 45/06 257/4 |

* cited by examiner

SEMICONDUCTOR MEMORY DEVICE HAVING A PLURALITY OF MEMORY CELLS EACH HAVING A PHASE CHANGE MATERIAL

CROSS-REFERENCE TO RELATED APPLICATION(S)

This application is based upon and claims the benefit of priority from Japanese Patent Application No. 2019-048620, filed Mar. 15, 2019, the entire contents of which are incorporated herein by reference.

FIELD

Embodiments described herein relate generally to a semiconductor memory device including a phase change memory element.

BACKGROUND

A known cross-point type semiconductor memory includes a phase change memory (PCM) element that is electrically connected between wirings that extend in intersecting directions and has a storage layer formed of a phase change material.

When the semiconductor memory is formed across multiple layers to achieve high integration, reliability of the operation of PCM elements in the lowermost layer and uppermost layer may be decreased.

DETAILED DESCRIPTION

In general, according to one embodiment, a semiconductor memory device includes a first wiring extending in a first direction, a second wiring above the first wiring and extending in a second direction intersecting the first direction, first and second memory cells electrically connected in parallel between the first and second wirings and each including a phase change material, a first insulating film on a side portion of the first memory cell that faces the second memory cell in the second direction, a third wiring above the second wiring and extending in the second direction, a fourth wiring above the third wiring and extending in the first direction, third and fourth memory cells electrically connected between the third and fourth wirings in parallel and each including a phase change material, a second insulating film on a side portion of the third memory cell that faces the fourth memory cell in the second direction. The first insulating film has a higher thermal insulation capacity than the second insulating film.

First Embodiment

Figure 1:
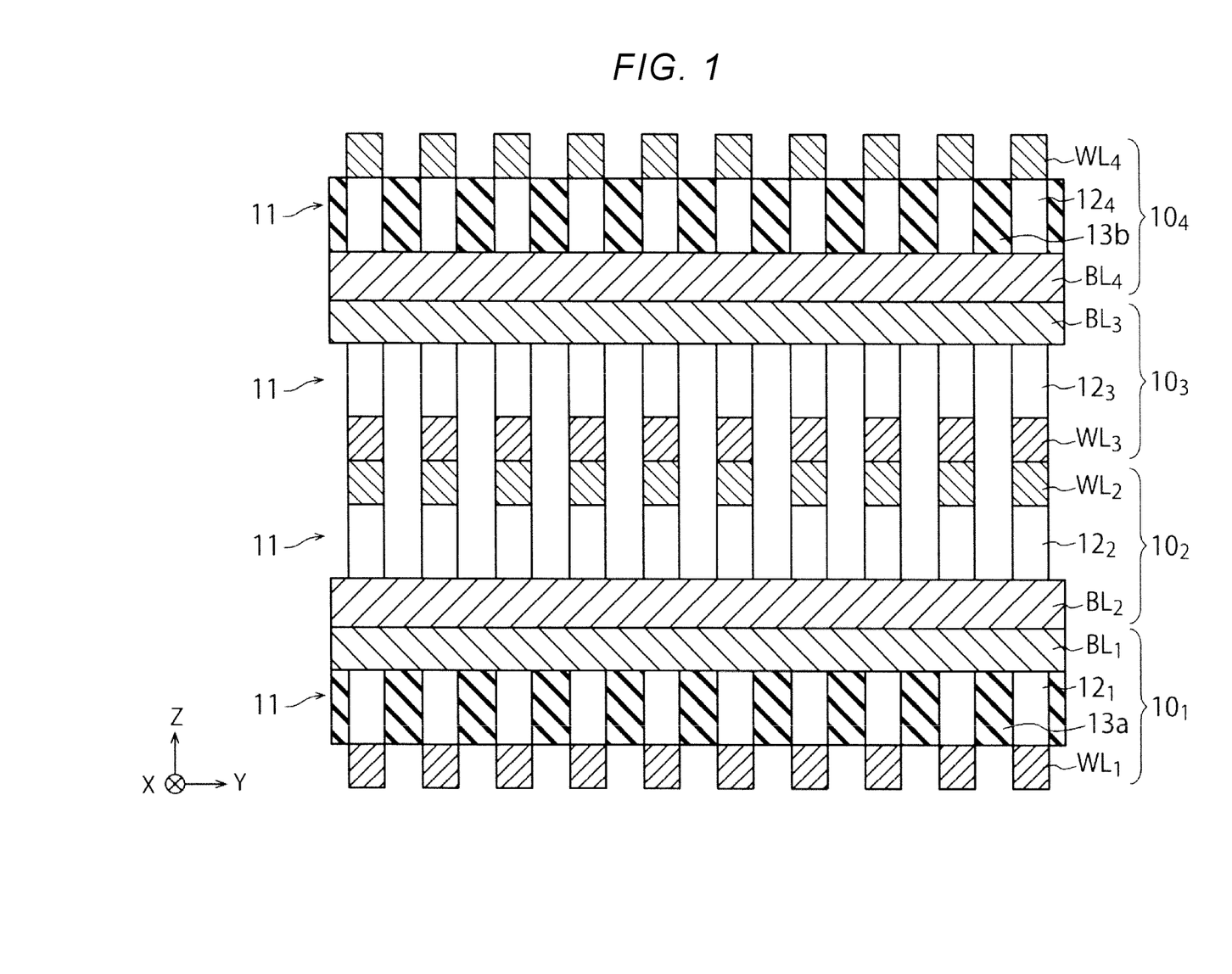
FIG. 1 is a cross-sectional view of a semiconductor memory device according to a first embodiment.

A cross section of a semiconductor memory device according to a first embodiment is shown in FIG. 1. The semiconductor memory device according to the first embodiment includes first to fourth semiconductor memories $10_1$ to $10_4$ that are formed across multiple layers. Each semiconductor memory $10_i$ (i=1, ..., 4) is a cross-point type semiconductor memory, and includes a plurality of phase change memory elements 11 (hereinafter, also referred to as memory cells). Further, each semiconductor memory $10_i$ (i=1, ..., 4) includes a plurality of word lines $WL_i$ (e.g., ten word lines) arranged in parallel, a plurality of bit lines $BL_i$ extending along a direction intersecting these word lines $WL_i$, and a storage unit $12i$ disposed in an intersection region between the word line $WL_i$ and the bit line $BL_i$. The plurality of bit lines $BL_i$ (i=1, ..., 4) are also arranged in parallel in the same manner as the word line $WL_i$. That is, in each semiconductor memory $10_i$ (i=1, ..., 4), each memory cell 11 includes a corresponding word line $WL_i$, a corresponding bit line $BL_i$, and the storage unit $12i$ provided in the intersection region between the word line $WL_i$ and the bit line $BL_i$. Therefore, in FIG. 2, each semiconductor memory $10_i$ (i=1, ..., 4) includes 10 memory cells 11.

Each word line $WL_1$ of the first semiconductor memory $10_1$ extends along x direction as shown in FIG. 1. The storage unit $12_1$ is disposed above these word lines $WL_1$. The bit line $BL_1$ is disposed above the storage unit $12_1$. The plurality of bit lines $BL_1$ separately extend along y direction intersecting the x direction, and FIG. 2 only shows one bit line $BL_1$. An interlayer insulating film (e.g., silicon oxide) (not shown) is disposed between the plurality of word lines $WL_1$. An insulating film 13a is formed of a material having a heat insulating property higher than that of a material of the above interlayer insulating film, and is disposed between the plurality of storage units $12_1$. In addition, an interlayer insulating film (not shown) is disposed between the plurality of bit lines $BL_1$. This interlayer insulating film is formed of a material having a heat insulating property lower than that of the material of the insulating film 13a.

The bit lines $BL_2$ of the second semiconductor memory $10_2$ are arranged along the y direction above the bit lines $BL_1$ of the first semiconductor memory $10_1$. The bit lines $BL_2$ are arranged in parallel in the same manner as the plurality of bit lines $BL_1$. The storage unit $12_2$ is disposed above each bit line $BL_2$ of the second semiconductor memory $10_2$. The word lines $WL_2$ of the second semiconductor memory $10_2$ are disposed above each storage unit $12_2$. The word lines $WL_2$ are arranged along the x direction in the same manner as the plurality of word lines $WL_1$. An interlayer insulating film (not shown) is disposed between the plurality of bit lines $BL_2$, between the plurality of storage units $12_2$, and between the plurality of word lines $WL_2$.

The word lines $WL_3$ of the third semiconductor memory $10_3$ are disposed above the word lines $WL_2$ of the second semiconductor memory $10_2$. The word lines $WL_3$ each extend along the x direction in the same manner as the word lines $WL_2$ of the second semiconductor memory $10_2$. Further, the storage units $12_3$ of the third semiconductor memory $10_3$ are disposed above these word lines $WL_3$. The bit lines $BL_3$ of the third semiconductor memory $10_3$ are disposed above the storage units $12_3$. The bit lines $BL_3$ each extend along the y direction. An interlayer insulating film (not shown) is disposed between the plurality of word lines $WL_3$, between the plurality of storage units $12_3$, and between the plurality of bit lines $BL_3$.

The bit lines $BL_4$ of the fourth semiconductor memory $10_4$ are disposed above the bit lines $BL_3$ of the third semiconductor memory $10_3$. The bit lines $BL_4$ each extend along the y direction in the same manner as the plurality of bit lines $BL_1$. The storage unit $12_4$ is disposed above each bit line $BL_4$ of the fourth semiconductor memory $10_4$. The word lines $WL_4$ of the fourth semiconductor memory $10_4$ are disposed above the storage units $12_4$. The word lines $WL_4$ each extend along the x direction in the same manner as the plurality of word lines $WL_1$. An interlayer insulating film (not shown) is disposed between the plurality of bit lines $BL_4$. An insulating film $13b$ is formed of a material having a higher heat insulating property than that of a material of the interlayer insulating film, and is disposed between the plurality of storage units $12_4$. Further, an interlayer insulating film (not shown) is disposed between the plurality of word lines $WL_4$. The interlayer insulating film is formed of a material having a heat insulating property lower than that of the material of the insulating film $13b$.

In this manner, in the semiconductor memory device according to the first embodiment and other embodiments described below, the first to fourth semiconductor memories $10_1$ to $10_4$ are stacked along z direction intersecting the x direction and the y direction.

Figure 2:
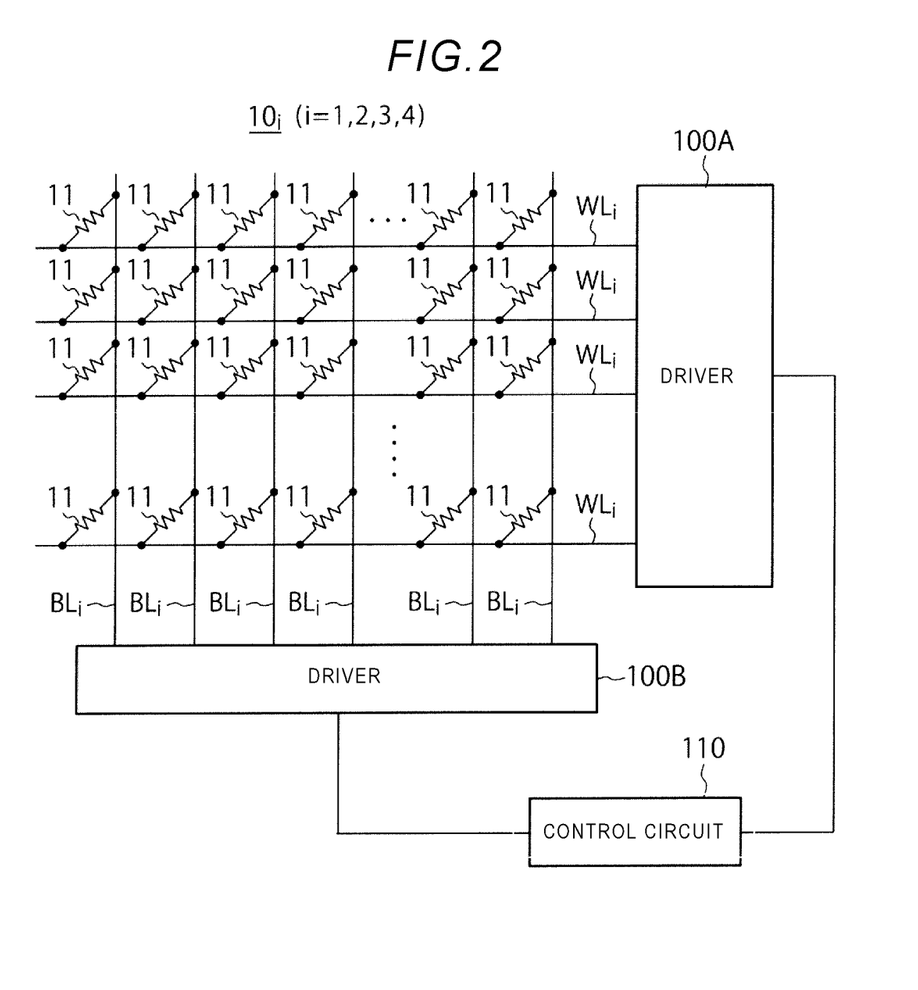
FIG. 2 is a circuit diagram of a semiconductor memory device according to the first embodiment.

Further, as shown in FIG. 2, in each semiconductor memory $10_i$ (i=1, 2, 3, 4), the plurality of word lines $WL_i$ are connected to a driver 100A, and the plurality of bit lines $BL_i$ are connected to a driver 100B. The driver 100A and the driver 100B are connected to a control circuit 110. The driver 100A selects one word line among the plurality of word lines $WL_i$ based on an instruction from the control circuit 110, and applies a write voltage to the selected word line. The driver 100B selects one bit line among the plurality of bit lines $BL_i$ based on an instruction from the control circuit 110, and applies a write voltage to the selected bit line. The memory cell 11 is disposed in the intersection region between each word line $WL_i$ and each bit line $BL_i$. One end of the memory cell 11 is connected to the corresponding word line $WL_i$, and the other end thereof is connected to the corresponding bit line $BL_i$. The driver 100A and the driver 100B may be provided in each semiconductor memory $10_i$ (i=1, 2, 3, 4), or may be provided commonly in all of the semiconductor memories $10_1$ to $10_4$.

In the semiconductor memory device according to the first embodiment and any one of the second to fourth embodiments described below, the memory cell 11 used for each of the semiconductor memories $10_1$ to $10_4$ has a structure shown in FIG. 3A. The memory cell 11 includes the storage unit $12i$ between the corresponding word line $WL_i$ (i=1, 2, 3, 4) and the corresponding bit line $BL_i$. The storage unit $12i$ has a structure in which a switching element $12a_i$ and a storage layer $12b_i$ are stacked. In the example shown in FIG. 3A, while the switching element $12a_i$ is provided on a word line $WL_i$ side, and the storage layer $12b_i$ is provided on a bit line $BL_i$ side, the switching element $12a_i$ may be provided on the bit line $BL_i$ side, and the storage layer $12b_i$ may be provided on the word line $WL_i$ side.

Figure 3A:
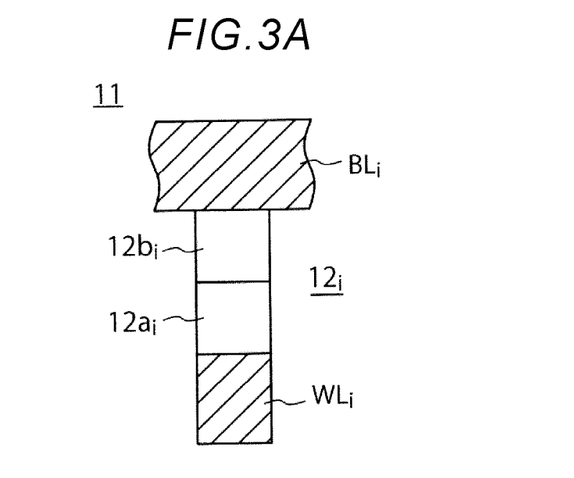
FIG. 3A is a cross-sectional view of a memory cell according to the first embodiment.

When the memory cell 11 shown in FIG. 3A is selected, the switching element $12a_i$ has a function of preventing a write current from flowing to another memory cell 11 that is not selected through the word line $WL_i$ or the bit line $BL_i$. That is, the switching element $12a_i$ is used to select the memory cell. Further, for example, AsGeTeSiN or SiTe is used as the switching element $12a_i$.

The storage layer $12b_i$ contains a phase change material that changes the phase between a crystalline phase and an amorphous phase. The phase change material includes, for example, a chalcogenide alloy (e.g., GeSbTe alloy). That is, the chalcogenide alloy includes chalcogenide and, for another example, an AsSbTe alloy, a TaSbTe alloy, a NbSbTe alloy, VSbTe alloy, a NbSbSe alloy, a VSbSe alloy, a WSbTe alloy, a WSbTe alloy, a MoSbTe alloy, a CrSbTe alloy, a WSbSe alloy, a MoSbSe alloy, a CrSbSe alloy or a SnSbTe alloy is used. After being heated and dissolved, the phase change material becomes the crystalline phase when subjected to slow cooling (i.e., gradual cooling) and has a low resistance value, and becomes the amorphous phase when subjected to rapid cooling and has a high resistance value. Therefore, a voltage is applied between the corresponding word line $WL_i$ and the corresponding bit line $BL_i$ of the memory cell to heat the storage unit $12i$, and thereafter, if a drop speed of the voltage is increased, the phase change material of the storage unit $12i$ is rapidly cooled to be in the amorphous phase and to be in the high resistance state. In addition, after being heated, if the drop speed of the voltage is reduced, the phase change material of the storage unit $12i$ is slowly cooled to be in the crystalline state and to be in the low resistance state.

The insulating layers $13a$ and $13b$ formed of a material having a heat insulating property higher than that of a material of the interlayer insulating film contains, for example, any one of porous silicon, silicon nitride, and carbon.

For example, the word line $WL_i$ (i=1, 2, 3, 4) and the bit line $BL_i$ are formed of tungsten (W). Alternatively, the word line $WL_i$ (i=1, 2, 3, 4) and the bit line $BL_i$ may be formed of stacked structure of tungsten (W), ruthenium (Ru), and molybdenum (Mo).

In the semiconductor memory device according to the first embodiment configured as described above, at least side surfaces of the storage layer $12b_1$ and the storage layer $12b_4$ of the memory cell 11 of the lowermost layer semiconductor memory $10_1$ and the memory cell 11 of the uppermost layer semiconductor memory $10_4$ are respectively covered with the insulating film $13a$ and the insulating film $13b$ having a high heat insulating property. Therefore, when a write voltage same as that of the memory cell of another layer semiconductor memory is applied to the memory cell 11 of the lowermost layer semiconductor memory $10_1$ or the uppermost layer semiconductor memory $10_4$, the heat escaping from the storage layer to the interlayer insulating film is reduced. That is, the memory cell 11 of the lowermost layer semiconductor memory $10_1$ and the memory cell 11 of the uppermost layer semiconductor memory $10_4$ can perform a reset operation using a reduced reset current. Therefore, according to the first embodiment, it is possible to provide a semiconductor memory device capable of preventing a decrease in reliability of a reset operation even during high integration. Therefore, the number of memory cells to be written by the driver can be increased, and the number of memory cells of the semiconductor memory provided in the same layer can be increased.

(Modification)

Figure 3B:
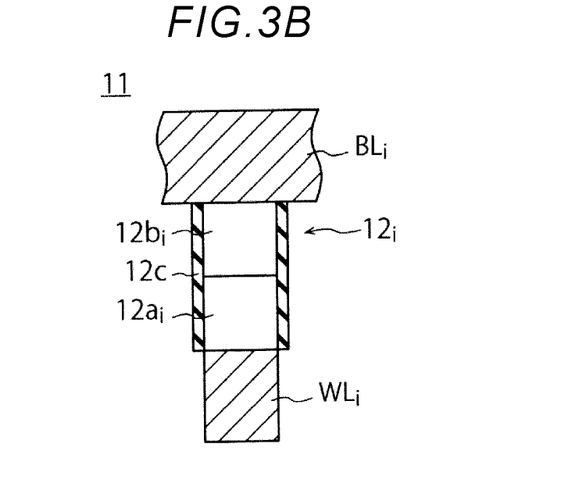
FIG. 3B is a cross-sectional view of a modification of the memory cell according to the first embodiment.

A modification of the memory cell 11 is shown in FIG. 3B. In the semiconductor memory device according to the first embodiment and any one of the second to fourth embodiments described below, the memory cell 11 of the modification is used as the memory cell of the semiconductor memories $10_1$ to $10_4$. In the memory cell 11 shown in FIG. 3B, a heat insulating layer 12c is provided to cover at least a side surface of the storage layer $12b_i$ (i=1, 2, 3, 4) in the memory cell shown in FIG. 3A. The heat insulating layer 12c is formed of a material having a heat insulating property higher than that of the material of the interlayer insulating film of the middle layer semiconductor memories $10_2$ and $10_3$. An interlayer insulating film having a heat insulating property lower than that of the material of the heat insulating layer 12c is provided between the memory cells 11. The heat insulating layer 12c may be provided to cover side surfaces of the switching elements $12a_1$ and $12a_4$.

When the memory cell 11 shown in FIG. 3B is used as the memory cells 11 of the middle layer semiconductor memories $10_2$ and $10_3$, the insulating films 13a and 13b formed of a material having a high heat insulating property are provided on the periphery of the memory cell 11 (i.e., the side portion of the memory cell 11) between the memory cells of the lowermost layer and uppermost layer semiconductor memories $10_1$ and $10_4$ in the same manner as the first embodiment shown in FIG. 1.

In addition, the memory cell 11 shown in FIG. 3B may also be used as the memory cells 11 of the lowermost layer and uppermost layer semiconductor memories $10_1$ and $10_4$. In this case, the memory cell 11 shown in FIG. 3B is not provided between the memory cells 11 of the middle layer semiconductor memories $10_2$ and $10_3$, and the interlayer insulating film having a low heat insulating property is provided in the same manner as the first embodiment. It is also possible to provide the memory cell 11 shown in FIG. 3B between the memory cells 11 of the semiconductor memories $10_2$ and $10_3$. In this case, a thickness of the heat insulating layer 12c in the y direction in the memory cell 11 of the semiconductor memories $10_1$ and $10_4$ is thicker than a thickness of the heat insulating layer 12c in the y direction in the memory cell 11 of the semiconductor memories $10_2$ and $10_3$.

In the present modification, it is also possible to provide a semiconductor memory device capable of preventing a decrease in reliability of a reset operation even during high integration.

Comparative Example

Figure 4:
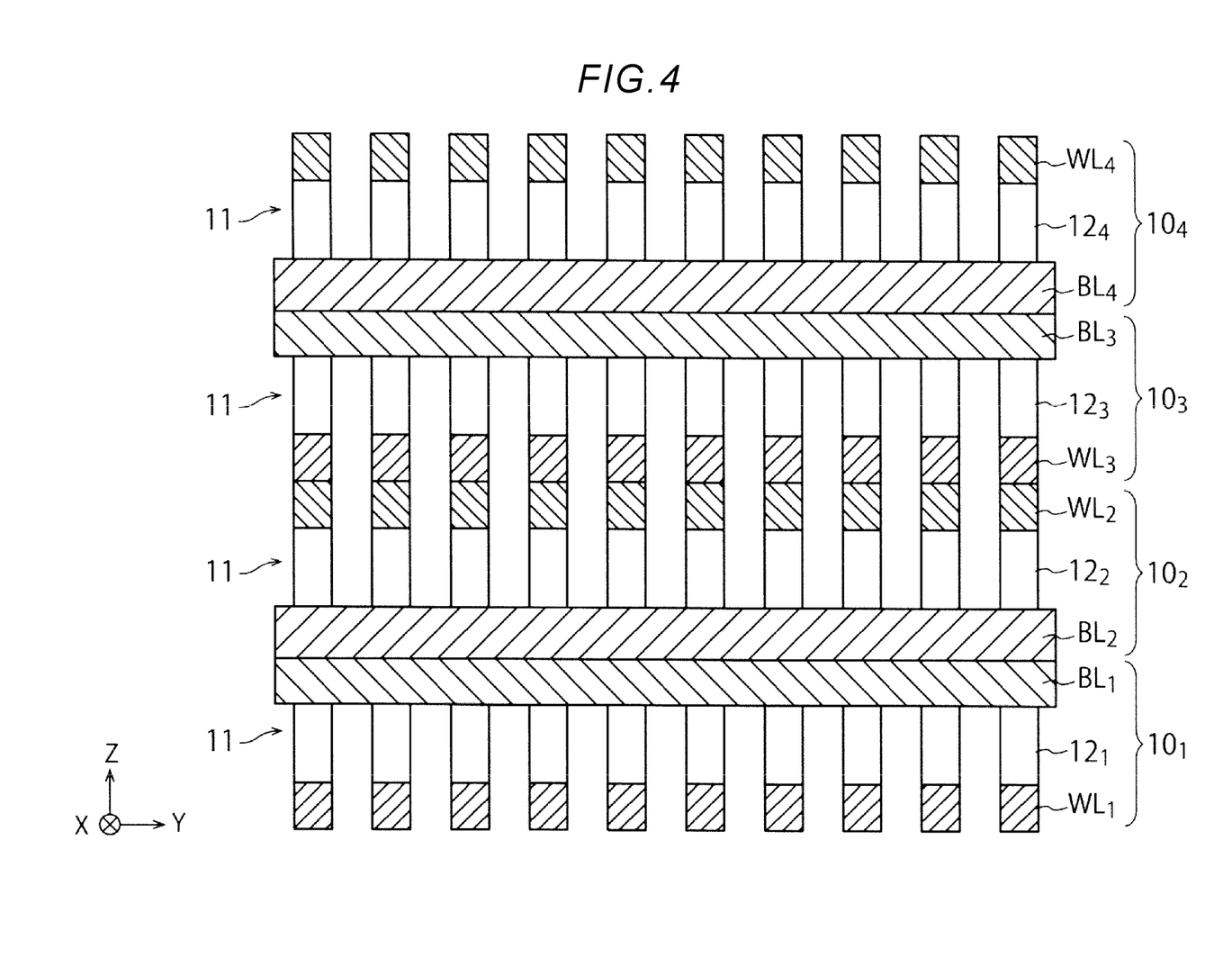
FIG. 4 is a cross-sectional view of a semiconductor memory device according to a comparative example.

Next, a semiconductor memory device according to a comparative example is shown in FIG. 4. The semiconductor memory device according to the comparative example has a configuration in which a material of the interlayer insulating film disposed on the periphery of the middle layer memory cell 11 (i.e., an insulating film having a heat insulating property lower than that of the material of the insulating films 13a and 13b) is disposed in the lowermost layer and uppermost layer semiconductor memories $10_1$ and $10_4$, instead of the insulating films 13a and 13b according to the first embodiment shown in FIG. 1.

In the semiconductor memory device according to the comparative example, the bit line $BL_1$ of the first semiconductor memory $10_1$ and the bit line $BL_2$ of the second semiconductor memory $10_2$ are disposed overlapping each other. The word line $WL_2$ of the second semiconductor memory $10_2$ and the word line $WL_3$ of the third semiconductor memory $10_3$ are disposed overlapping each other. The bit line $BL_3$ of the third semiconductor memory $10_3$ and the bit line $BL_4$ of the fourth semiconductor memory $10_4$ are disposed overlapping each other. However, a lowermost layer wiring of the lowermost layer (i.e., word line $WL_1$ in FIG. 4) and an uppermost layer wiring of the uppermost layer (i.e., word line $WL_4$ in FIG. 4) of the lowermost layer of the semiconductor memories do not overlap with any other wiring (i.e., are not adjacent to any other wiring), as compared with other overlapped wirings, for example, the bit line $BL_1$ of the first semiconductor memory $10_1$ and the bit line $BL_2$ of the second semiconductor memory $10_2$. Thus, the thickness of each of the lowermost layer wiring and the uppermost layer wiring of the uppermost layer is thinner. Therefore, when a write voltage is applied to the corresponding memory cell 11, the wiring resistance is high.

Therefore, even when the same write voltage is applied to the corresponding bit line and the corresponding word line in a reset operation of the memory cells 11 of the lowermost layer semiconductor memory $10_1$ and the uppermost layer semiconductor memory $10_4$, that is, an operation is performed to change the state of the memory cells from the low resistance state (i.e., the crystalline state) to the high resistance state (i.e., the amorphous state), as compared with the operation the memory cells of other layer semiconductor memories $10_2$ and $10_3$, the write current supplied to the corresponding storage unit 12i is smaller, and the reset operation is not normally performed. Therefore, the number of the memory cells to be written by a writing circuit cannot be increased, and the number of the memory cells of the semiconductor memory provided in the same layer is limited.

(Method for Manufacturing Semiconductor Memory Device According to First Embodiment)

Next, a method for manufacturing the semiconductor memory device according to the first embodiment will be described with reference to FIG. 5A to FIG. 5F.

Figure 5A:
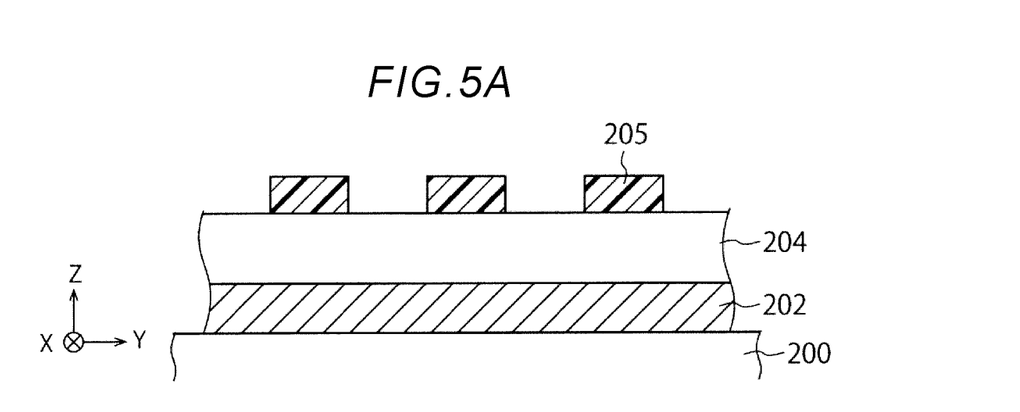
FIG. 5A to FIG. 5F are cross-sectional views for explaining a method for manufacturing the semiconductor memory device according to the first embodiment.

As shown in FIG. 5A, a wiring material layer 202 is formed above a semiconductor layer 200, and a memory cell material layer 204 is formed above the wiring material layer 202. Thereafter, a line-and-space shaped mask 205 that extends along the x direction is formed above the memory cell material layer 204. The mask 205 is formed of, for example, a photosensitive resin, and is formed by using a lithography technique.

Figure 5B:
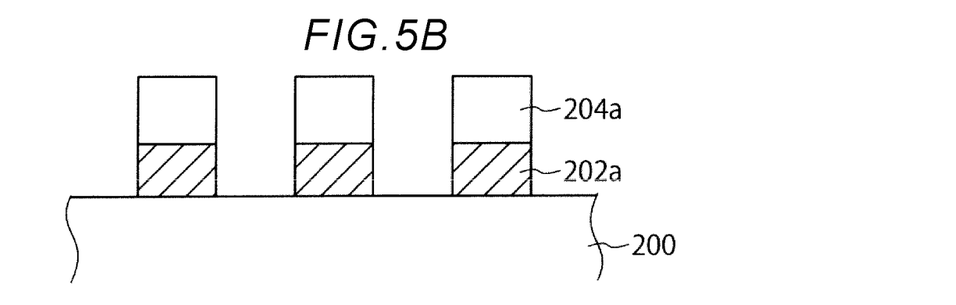

Next, for example, reactive ion etching (RIE) is performed on the memory cell material layer 204 by using the mask 205 to form a line-shaped pattern 204a that extends along the x direction. Thereafter, RIE is performed on the wiring material layer 202 by using the mask 205 to form a line-shaped wiring 202a that extends along the x direction (FIG. 5B). The wiring 202a is, for example, the word line $WL_1$ shown in FIG. 1.

Figure 5C:
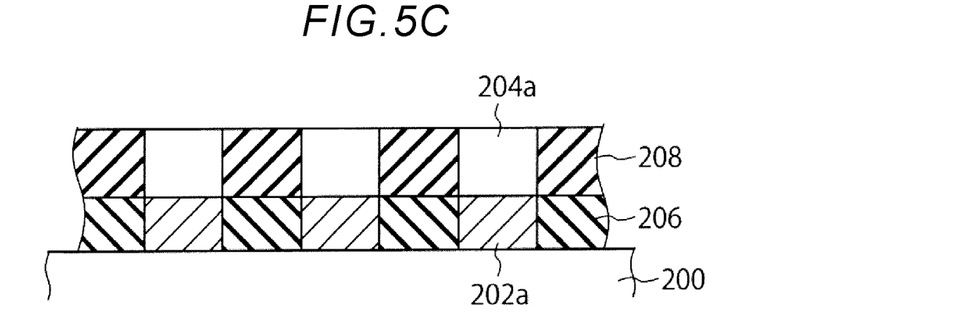

Subsequently, as shown in FIG. 5C, the mask 205 is removed, then an insulating material 206 to be an interlayer insulating film is formed to cover a side portion of the wiring 202a, and thereafter, an insulating film 208 formed of a material having a heat insulating property higher than that of the insulating material 206 is formed to embed a side portion of the pattern 204a and to cover an upper surface of the pattern 204a. Thereafter, the insulating film 208 is flattened by using chemical mechanical polishing (CMP) to expose the upper surface of the pattern 204a.

Figure 5D:
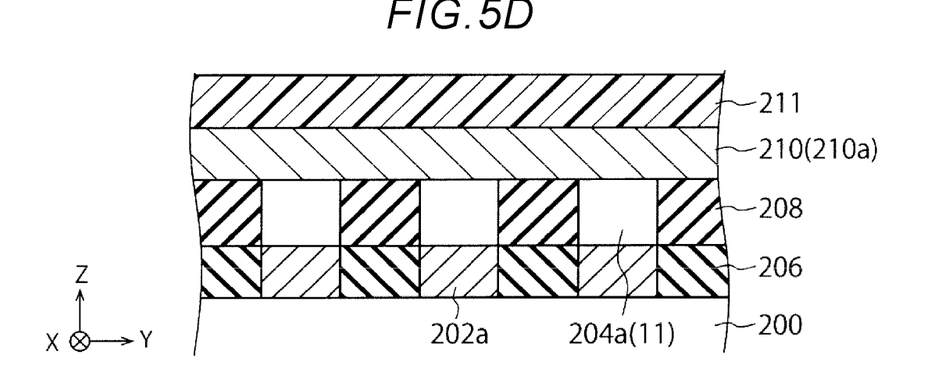

Next, as shown in FIG. 5D, a wiring material layer 210 is formed to cover the pattern 204a, and a mask 211 formed of, for example, a photosensitive resin is formed above the wiring material layer 210. The mask 211 has a line-and-space shape that extends along the y direction. Subsequently, the wiring material layer 210 is patterned by using the mask 211 to form a wiring 210a. The wiring 210a is, for example, the bit line $BL_1$ shown in FIG. 1.

Thereafter, the pattern 204a is patterned by using the mask 211 to form the memory cell 11. Subsequently, an insulating film formed of a material having a heat insulating property higher than that of the insulating material 206 is formed to cover a side surface of the memory cell 11 intersecting the x direction. Thereafter, the mask 211 is removed, and an interlayer insulating film (not shown) is formed to embed between the wirings 210a and to cover the upper surface of the wiring 210a. The interlayer insulating film is flattened by using CMP to expose the upper surface of the wiring 210a.

Figure 5E:
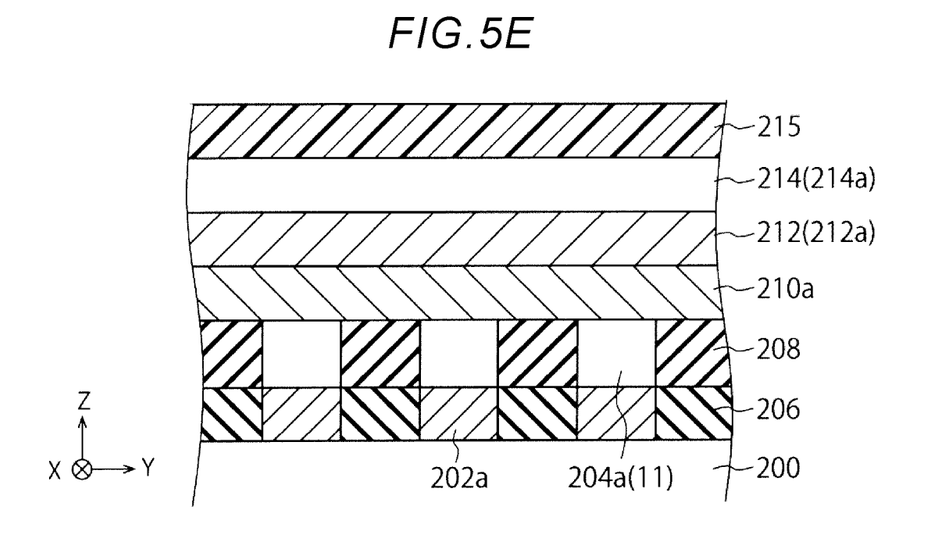

Next, as shown in FIG. 5E, a wiring material layer 212 is formed to cover the wiring 210a and the interlayer insulating film, and thereafter, a memory cell material layer 214 is formed. A mask 215 is formed above the memory cell material layer 214. The mask 215 has a line-and-space shape that extends along the y direction, and is formed to overlap with the wiring 210a. The memory cell material layer 214 is patterned by using the mask 215, so to form a pattern 214a. The pattern 214a has a line-and-space shape that extends along the y direction. Further, the wiring material layer 212 is patterned to form the wiring 212a.

Thereafter, the mask 215 is removed, an interlayer insulating film (not shown) is formed to embed between the wirings 212a and between the patterns 214a and to cover the pattern 214a. Subsequently, the interlayer insulating film is flattened by using CMP to expose the upper surface of the pattern 214a.

Figure 5F:
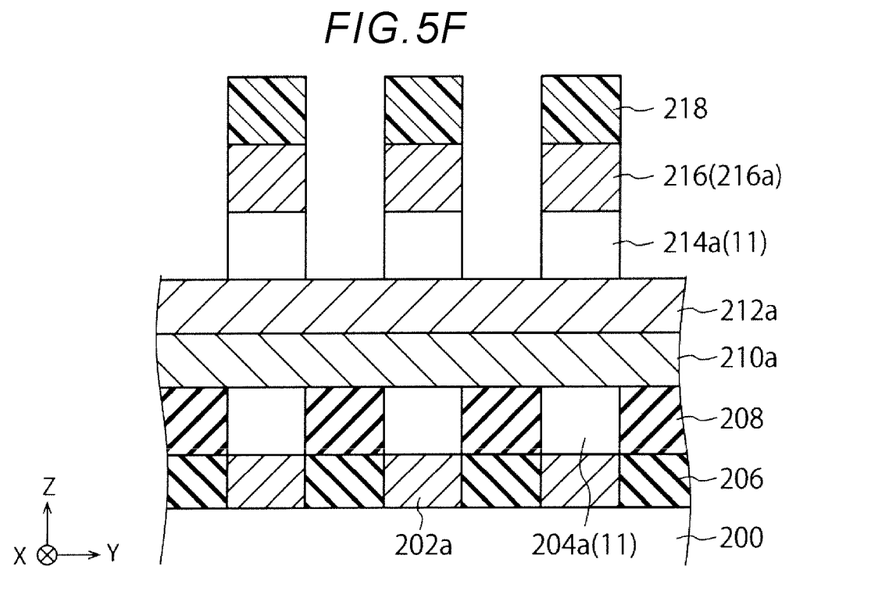

Next, as shown in FIG. 5F, a wiring material layer 216 is formed above the interlayer insulating film (not shown) and the pattern 214a, and a mask 218 is formed above the wiring material layer 216. The mask 216 has a line-and-space shape that extends along the x direction, and is formed to overlap with the wiring 202a. The wiring material layer 216 and the pattern 214a are patterned by using the mask 218, so as to form a wiring 216a and the memory cell 11. The wiring 216a is the word line $WL_2$ shown in FIG. 1. Thereafter, the mask 218 is removed, an interlayer insulating film (not shown) is formed to embed between the wirings 216a and between the memory cells 11 and to cover the memory cell 11. The interlayer insulating film is flattened by using CMP to expose the upper surface of the memory cell 11.

Subsequently, the steps shown in FIG. 5A to FIG. 5F are repeated to complete the semiconductor memory device. At this time, in the step shown in FIG. 5C, instead of forming the insulating film 208 having a high heat insulating property, an interlayer insulating film 206 having a low heat insulating property is formed. The insulating film 208 having a heat insulating property higher than that of the interlayer insulating film 206 is formed on a side portion of the memory cell of the uppermost layer semiconductor memory.

Second Embodiment

Figure 6:
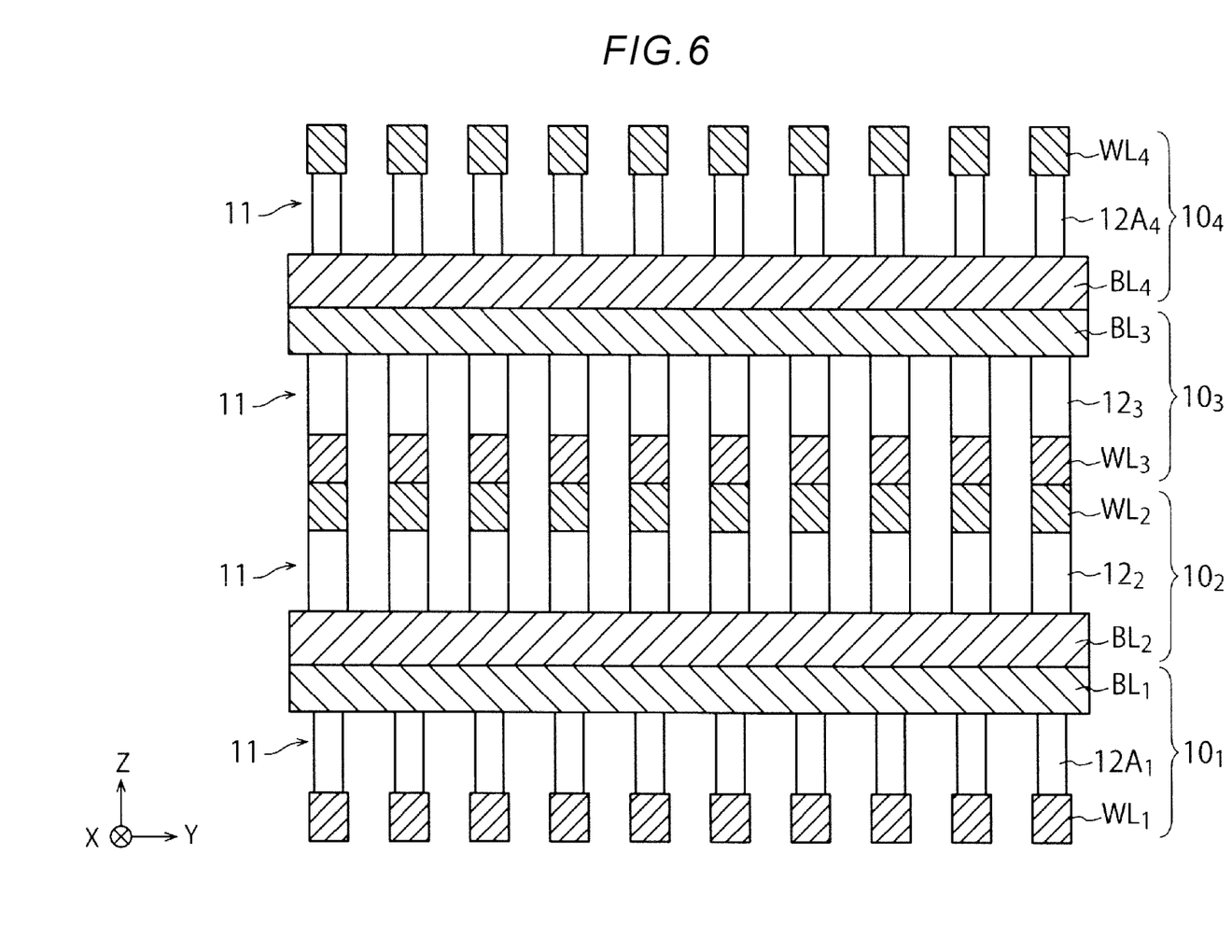
FIG. 6 is a cross-sectional view of a semiconductor memory device according to a second embodiment.

A semiconductor memory device according to a second embodiment is shown in FIG. 6. In the semiconductor memory device according to the second embodiment, with respect to the semiconductor memory device according to the first embodiment shown in FIG. 2, the insulating film 13a having a high heat insulating property from the first semiconductor memory $10_1$ is removed, the insulating film 13b having a high heat insulating property from the fourth semiconductor memory $10_4$ is removed, and the storage unit $12_1$ and the storage unit $12_4$ are replaced with a storage unit $12A_1$ and a storage unit $12A_4$ respectively.

Compared with the storage unit $12i$ shown in FIG. 4, in each of the storage unit $12A_1$ of the first semiconductor memory $10_1$ and the storage unit $12A_4$ of the fourth semiconductor memory $10_4$, a width of the storage layer $12b_i$ is narrow, that is, a length in the y direction is short. Therefore, an overall volume is smaller than that of the storage layer $12b_i$ of other semiconductor memories $10_2$ and $10_3$, a reset current of the storage layer $12b_i$ of the first semiconductor memory $10_1$ and the fourth semiconductor memory $10_4$ can be reduced, and a reset operation can be normally performed even when the same write voltage as in the case of the semiconductor memories $10_2$ and $10_3$ is applied. That is, reliability of the reset operation can be increased.

Figure 7A:
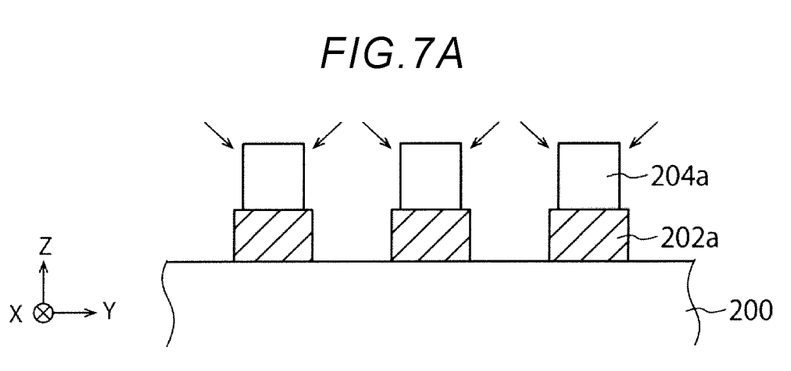
FIG. 7A is a cross-sectional view for explaining a method for manufacturing the semiconductor memory device according to the second embodiment.

Next, a method of manufacturing the semiconductor memory device according to the second embodiment will be described with reference to FIG. 7A. The same steps explained in FIG. 5A and FIG. 5B for the semiconductor memory device according to the first embodiment are performed. Thereafter, as shown in FIG. 7A, the pattern 204a is irradiated with an ion beam from a direction inclined with respect to a stacking direction (i.e., the z direction) to slim the pattern 204a. The slimming is performed to reduce the length of the pattern 204a in the y direction. Alternatively, the slimming may be performed to reduce the length of the pattern 204a in the x direction. Further, the lengths of the patterns 204a in the x direction and the y direction may be reduced, separately.

Thereafter, the steps described in FIG. 5C to FIG. 5F are performed, and then the steps shown in FIG. 5A to FIG. 5F are repeated. At this time, in the step shown in FIG. 5C, the interlayer insulating film 206 is formed instead of forming the insulating film 208. Further, the memory cell of the uppermost layer semiconductor memory is slimmed.

Figure 7B:
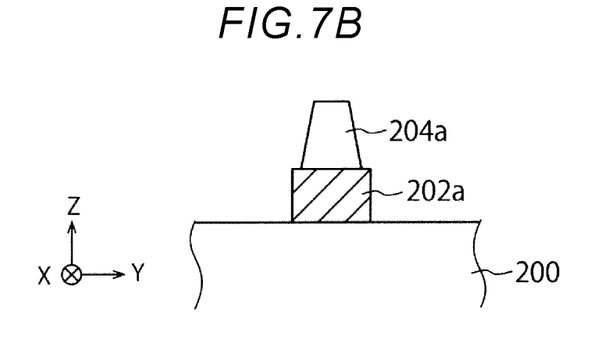
FIG. 7B is a cross-sectional view of a modification of the semiconductor memory device according to the second embodiment.

In the second embodiment, as shown in FIG. 7B, the pattern 204a to be the storage layer $12b_i$ may have a tapered shape in which a length in the y direction decreases from a lower surface to an upper surface. That is, the pattern 204a to be the storage layer $12b_i$ may have a tapered shape in which an area of a cross section cut along the x-y plane decreases from the lower surface to the upper surface. In the pattern 204a to be the storage layer $12b_i$, the length of the lower surface in the y direction may be longer than the length of the upper surface in the y direction. In addition, in the pattern 204a to be the storage layer $12b_i$, the area of the lower surface may be larger than the area of the upper surface.

Third Embodiment

Figure 8:
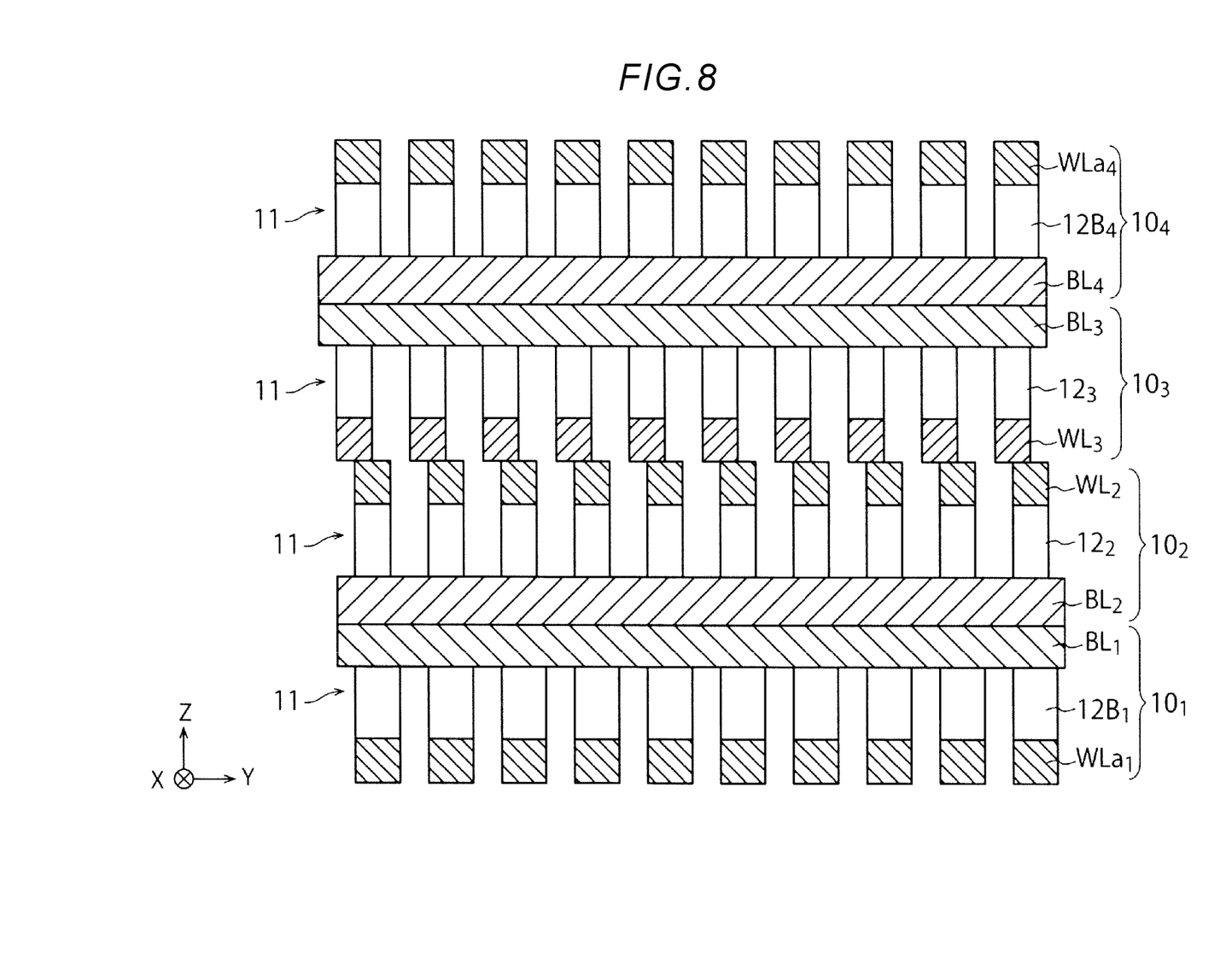
FIG. 8 is a cross-sectional view of a semiconductor memory device according to a third embodiment.

A semiconductor memory device according to a third embodiment is shown in FIG. 8. In the semiconductor memory device of the third embodiment, with respect to the semiconductor memory device according to the first embodiment shown in FIG. 2, the insulating film 13a having a high heat insulating property from the first semiconductor memory $10_1$ is removed, the insulating film 13b having a high heat insulating property from the fourth semiconductor memory $10_4$ is removed, the word line $WL_1$ of the first semiconductor memory $10_1$ is replaced with a word line $WLa_1$, the storage unit $12_1$ is replaced with a storage unit $12B_1$, the word line $WL_4$ of the fourth semiconductor memory $10_4$ is replaced with a word line $WLa_4$, and the storage unit $12_4$ is replaced with a storage unit $12B_4$.

As compared with the word line $WL_2$ and the word line $WL_3$, the word line $WLa_1$ and the word line $WLa_4$ are larger in width, that is, a length in the y direction is long, and are larger in thickness, that is, a length in the z direction is long. The lengths of the storage unit $12B_1$ and the storage unit $12B_4$ are longer than those of the storage unit $12_2$ and the storage unit $12_3$ in the y direction. The lengths of the storage units $12B_1$ and the storage units $12B_4$ in the y direction are respectively the same as the lengths of the word line $WLa_1$ and the word line $WLa_4$ in the y direction. This is because the storage units $12B_1$ and $12B_4$ and the word lines $WLa_1$ and $WLa_4$ are processed (i.e., patterned) by using the same mask. However, the storage units $12B_1$ and $12B_4$ and the word lines $WLa_1$ and $WLa_4$ do not need to have the same length.

In the third embodiment, the lengths of the word line $WLa_1$ and the word line $WLa_4$ are longer than those of the word lines $WL_2$ and $WL_3$ in the y and z directions. Therefore, the wiring resistance can be reduced as compared with the semiconductor memory device shown in FIG. 1, and although the reset current of the memory cells 11 of the first semiconductor memory $10_1$ and the fourth semiconductor memory $10_4$ is increased as compared with the second and the third semiconductor memories $10_2$ and $10_3$, the reset operation is stable, and reliability of the reset operation can be increased. In the third embodiment, the lengths of the word line $WLa_1$ and the word line $WLa_4$ are longer than those of the word lines $WL_2$ and $WL_3$ in both the y and z directions, but only the lengths in the y direction may be increased.

Even when the word line $WLa_1$ and the word line $WLa_4$ have the same length as the word lines $WL_2$ and $WL_3$ in the y and z directions and are formed by using a material having an electric conductivity higher than that of the word lines $WL_2$ and $WL_3$, the same effect can be obtained.

In addition, in the third embodiment shown in FIG. 8, the word line $WL_2$ and the word line $WL_3$ may be misaligned, but only a part thereof overlaps. This is because misalignment occurs between the mask that forms the word line $WL_2$ and the mask that forms the word line $WL_3$.

Fourth Embodiment

Figure 9:
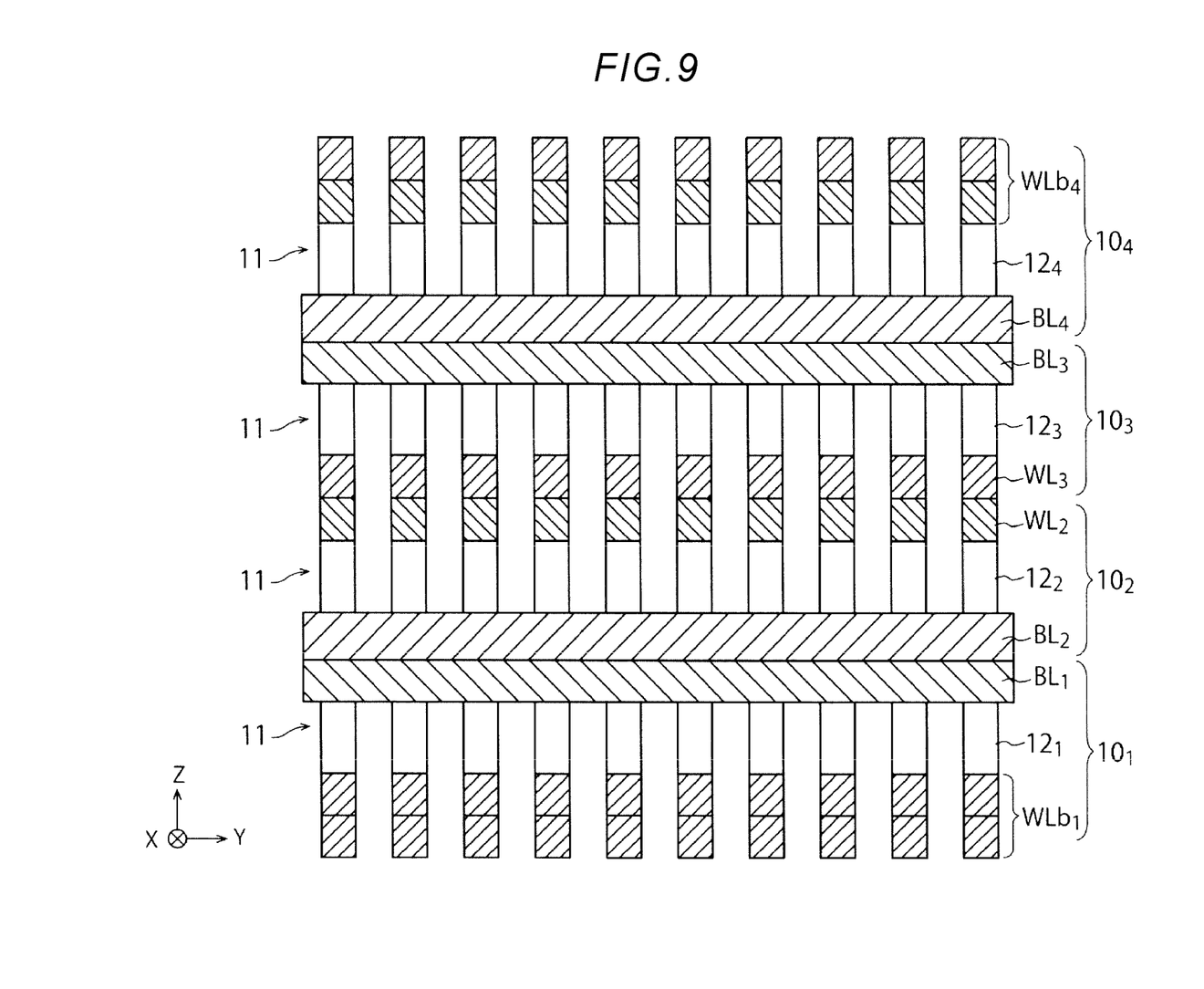
FIG. 9 is a cross-sectional view of a semiconductor memory device according to a fourth embodiment.

A semiconductor memory device according to a fourth embodiment is shown in FIG. 9. In the semiconductor memory device according to the fourth embodiment, with respect to the semiconductor memory device according to the first embodiment shown in FIG. 2, the insulating film 13a having a high heat insulating property from the first semiconductor memory $10_1$ is removed, the insulating film 13b having a high heat insulating property from the fourth semiconductor memory $10_4$ is removed, the word line $WL_1$ of the first semiconductor memory $10_1$ is replaced with a word line $WLb_1$, and the word line $WL_4$ of the fourth semiconductor memory $10_4$ is replaced with a word line $WLb_4$.

The lengths of the word line $WLb_1$ and the word line $WLb_4$ in the z direction are longer than, for example, twice longer the lengths of the word line $WL_2$ and the word line $WL_3$ in the z direction. Therefore, formation of the word line $WLb_1$ and the word line $WLb_4$ is performed by repeating the steps same as the steps of forming the word line $WL_2$ or the word line $WL_3$ twice.

In the fourth embodiment, the lengths of the word line $WLb_1$ and the word line $WLb_4$ are longer than those of the word lines $WL_2$ and $WL_3$ in the z direction. Therefore, the wiring resistance can be reduced as compared with the semiconductor memory device shown in FIG. 1. Accordingly, the reset operation is stable, and reliability of the reset operation can be improved.

Even when the word line $WLb_1$ and the word line $WLb_4$ have the same length as the word lines $WL_2$ and $WL_3$ in the z direction and are formed by using a material having an electric conductivity high than that of the word lines $WL_2$ and $WL_3$, the same effect can be obtained.

As described above, the semiconductor memory device according to any one of the first to fourth embodiments can increase the reliability of the reset operation.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   first wirings extending in a first direction;
   a second wiring above the first wirings and extending in a second direction intersecting the first direction;
   first and second memory cells electrically connected in parallel between the first wirings and the second wiring and each including a phase change material;
   a first insulating film between the first and second memory cells;
   a third wiring above the second wiring and extending in the second direction;
   fourth wirings above the third wiring and extending in the first direction;
   third and fourth memory cells electrically connected between the third wiring and the fourth wirings in parallel and each including a phase change material; and
   an interlayer insulating film between the third and fourth memory cells, wherein
   the first insulating film has a higher thermal insulation capacity than the interlayer insulating film.

2. The semiconductor memory device according to claim 1, further comprising:
   fifth wirings above the fourth wiring and extending in the first direction;
   a sixth wiring above the fifth wirings and extending in the second direction; and
   fifth and sixth memory cells electrically connected in parallel between the fifth wirings and the sixth wiring and each including a phase change material, wherein
   the interlayer insulating film is between the fifth and sixth memory cells.

3. The semiconductor memory device according to claim 2, further comprising:
   a seventh wiring above the sixth wiring and extending in the second direction;
   eighth wirings above the seventh wiring and extending in the first direction;
   seventh and eighth memory cells electrically connected in parallel between the seventh wiring and the eighth wirings and each including a phase change material; and a second insulating film between the seventh and eighth memory cells, wherein
the second insulating film has a higher thermal insulation capacity than the interlayer insulating film.

4. The semiconductor memory device according to claim 3, wherein
the first wirings, the second wiring, the first and second memory cells, and the first insulating film are included in a lowermost layer of the semiconductor memory device, and
the seventh wiring, the eighth wirings, the seventh and eighth memory cells, and the second insulating film are included in an uppermost layer of the semiconductor device.

5. The semiconductor memory device according to claim 1, wherein
the second and third wirings are in contact with each other.

6. The semiconductor memory device according to claim 1, wherein
the first insulation film covers an entire side surface of the first memory cell.

7. The semiconductor memory device according to claim 1, wherein
the first insulating film contains one of porous silicon, silicon nitride, and carbon.

8. The semiconductor memory device according claim 1, wherein
each memory cell includes a storage layer containing the phase change material and a switching element to select the memory cell.

9. The semiconductor memory device according to claim 1, wherein
the phrase change material is chalcogenide.

10. The semiconductor memory device according to claim 1, further comprising:
a heat insulating layer between the first insulating film and each of the first and second memories and having a higher thermal insulating capacity than the interlayer insulating film.

11. A semiconductor memory device comprising:
a first wiring extending in a first direction;
a second wiring above the first wiring and extending in a second direction intersecting the first direction;
a first memory cell electrically connected between the first and second wirings and including a phase change material;
a third wiring above the second wiring and extending in the second direction;
a fourth wiring above the third wiring and extending in the first direction; and
a second memory cell electrically connected between the third and fourth wirings and including a phase change material, wherein
the first memory cell has a shorter length in the second direction than the second memory cell.

12. The semiconductor memory device according to claim 11, further comprising:
a fifth wiring above the fourth wiring and extending in the first direction;
a sixth wiring above the fifth wiring and extending in the second direction;
a third memory cell electrically connected between the fifth and sixth wirings and including a phase change material, wherein
the first memory cell has a shorter length in the second direction than the third memory cell.

13. The semiconductor memory device according to claim 12, wherein
the second and third memory cells have substantially the same length in the second direction.

14. The semiconductor memory device according to claim 12, further comprising:
a seventh wiring above the sixth wiring and extending in the second direction;
an eighth wiring above the seventh wiring and extending in the first direction; and
a fourth memory cell electrically connected between the seventh and eighth wirings and including a phase change material, wherein
the fourth memory cell has a shorter length in the second direction than the second and third memory cells.

15. The semiconductor memory device according to claim 14, wherein
the first wiring, the second wiring, the first memory cell, and the first insulating film are included in a lowermost layer of the semiconductor memory device, and
the seventh wiring, the eighth wiring, and the fourth memory cell are included in an uppermost layer of the semiconductor device.

16. The semiconductor memory device according claim 11, wherein
each memory cell includes a storage layer containing the phase change material and a switching element to select the memory cell.

17. The semiconductor memory device according to claim 11, wherein
the phrase change material is chalcogenide.

18. A semiconductor memory device comprising:
a first wiring extending in a first direction;
a second wiring above the first wiring and extending in a second direction intersecting the first direction;
a first memory cell electrically connected between the first and second wirings and including a phase change material;
a third wiring above the second wiring and extending in the second direction;
a fourth wiring above the third wiring and extending in the first direction; and
a second memory cell electrically connected between the third and fourth wirings and including a phase change material, wherein
the first wiring has a longer length in the second direction than the fourth wiring.

19. The semiconductor memory device according to claim 18, further comprising:
a fifth wiring above the fourth wiring and extending in the first direction;
a sixth wiring above the fifth wiring and extending in the second direction; and
a third memory cell electrically connected between the fifth and sixth wirings and including a phase change material, wherein
the first wiring has a longer length in the second direction than the fifth wiring.

20. The semiconductor memory device according to claim 19, further comprising:
a seventh wiring above the sixth wiring and extending in the second direction;
an eighth wiring above the seventh wiring and extending in the first direction;
a fourth memory cell electrically connected between the seventh and eighth wirings and including a phase change material, wherein the eighth wiring has a longer length in the second direction than the fourth and fifth wirings.

* * * * *